(12) United States Patent
Kim et al.

(10) Patent No.: US 6,432,816 B2
(45) Date of Patent: Aug. 13, 2002

(54) METHOD FOR FABRICATING SEMICONDUCTOR DEVICE

(75) Inventors: Jeong Ho Kim; Jae Seon Yu, both of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/741,878

(22) Filed: Dec. 22, 2000

(30) Foreign Application Priority Data

Dec. 24, 1999 (KR) .......................................... 99-61846

(51) Int. Cl.$^7$ .......................................... H01L 21/4763

(52) U.S. Cl. ...................................... 438/637; 438/299

(58) Field of Search ................................ 438/637, 639, 438/229, 640, 233, 634, 299, 303, 396, 253, 672, 675, 691, 667, 668, 706, 735, 745

(56) References Cited

U.S. PATENT DOCUMENTS

| 6,010,935 A | * | 1/2000 | Doan | 438/303 |
| 6,057,581 A | * | 5/2000 | Doan | 257/401 |
| 6,268,252 B1 | * | 7/2001 | Lee et al. | 438/299 |

* cited by examiner

*Primary Examiner*—David Nelms
*Assistant Examiner*—David Nhu
(74) *Attorney, Agent, or Firm*—Pillsbury Winthrop LLP

(57) ABSTRACT

The present invention discloses a method for fabricating a semiconductor device. A protective film for protecting a device isolation film is formed on the device isolation film for the contact hole formation process, thereby preventing a device isolation film from being damaged due to misalignment in a lithography process or overetch during the etch process. Accordingly, gate induced drain leakage current is not generated, contact junction leakage current is reduced, and the contact properties are improved. Improvements in the contact properties produce corresponding improvements in the properties and yield of the semiconductor devices manufactured according to the invention.

13 Claims, 6 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular to an improved method for fabricating a semiconductor device which can optimize an electric property of the high integration device, by preventing a device isolation film from being damaged in a contact plug formation process.

2. Description of the Background Art

Recently, the increasingly high integration of semiconductor devices has been remarkably influenced by the development of techniques for forming fine patterns. Especially, it is essential to be able to miniaturize photoresist film patterns used to mask etching or ion implantation processes during the fabrication of semiconductor devices.

Resolution (R) of the photoresist film pattern is proportional to the light source wavelength ($\lambda$) and a process variable (k) of a micro exposure device, and is inversely proportional to a numerical aperture of the exposure device.

$$R = k \times \lambda / NA$$

Thus, in order to improve optical resolution of the micro exposure device, the wavelength of the light source may be decreased. For example, resolution of the G-line and I-line micro exposure devices having a wavelength of 436 nm and 365 nm is about 0.7 $\mu$m and 0.5 $\mu$m, respectively. Accordingly, exposure devices using a deep ultraviolet (DUV) light having a small wavelength, for example a KrF laser at 248 nm or an ArF laser at 193 nm, are used to form fine patterns below 0.5 $\mu$m. In addition, in order to improve the resolution, various methods have been suggested including using a phase shift mask as a photo mask; adding a contrast enhancement layer (CEL) for enhancing an image contrast on a wafer; using a tri-layer resist (TLR) for positioning an intermediate layer such as a spin on glass (SOG) film between two photoresist films; and a silylation of the photoresist by selectively implanting silicon into the upper portion of a photoresist film.

According to the degree of integration of the semiconductor device, the size of a contact hole connecting upper and lower conductive interconnections and the space between the contact hole and an adjacent interconnection may be decreased, and the aspect ratio of the contact hole may be increased. A highly integrated semiconductor device having multi-layer conductive interconnection requires precise mask alignment in the fabrication process to form the contact hole, thereby reducing process margin.

In order to maintain a space between the contact holes and surrounding interconnections, masks are formed in consideration of and to allow for misalignment tolerance in the mask alignment, lens distortion in the exposure process, critical dimension variation in the mask formation, and photoetching processes, and mask registration offsets.

In addition, there has been taught a self aligned contact (SAC) method for forming a contact hole according to the self alignment method to overcome a disadvantage of the lithography process.

The SAC method may use a polysilicon layer, a nitride film or an oxynitride film as an etch barrier film depending on the process requirements. In general, the nitride film is most commonly employed as the etch barrier film.

Although not illustrated, a conventional SAC method for fabricating a semiconductor device will now be described.

A substructure, for example a device isolation insulation film, a gate insulation film, and a metal-oxide semiconductor field effect transistor (MOSFET) consisting of a gate electrode overlapped with a mask oxide film pattern and source/drain regions is formed on a semiconductor substrate, and an etch barrier film and an interlayer insulation film consisting of an oxide film are sequentially formed over the resultant structure.

A photoresist film pattern is the transformed to expose the interlayer insulation film in the intended contacts region of a storage electrode or bit line on the semiconductor substrate.

The interlayer insulation film exposed by the photoresist film pattern is dry-etched to expose the etch barrier film. A contact hole is then formed by etching the etch barrier film.

In the conventional SAC method for fabricating the semiconductor device, the bit line contact and the storage electrode contact are formed according to the SAC method using the nitride film or oxynitride film. Here, when a protective film is not provided on the device isolation film during the etching process for the interlayer insulation film, the device isolation film will be etched, and thus produce a gate induced drain leakage current, thereby deteriorating the device properties. Accordingly, an SiN or SiON film is deposited to protect the device isolation film during the process of etching the interlayer insulation film.

However, the stress of the SiN film is relatively high, and thus the surface of the active region may still be damaged. For instance, when the SiN film contacts the silicon substrate in the active region, the contact junction leakage current is typically increased by one to three times due to the stress, thereby deteriorating the contact properties and the device operation properties.

SUMMARY OF THE INVENTION

Accordingly, it is an object of the present invention to provide a method for fabricating a semiconductor device which can prevent a gate induced drain leakage current from being generated by damage to the device isolation film during the etching process for forming a contact hole according to a self aligned contact process. This object is achieved by forming a protective film at the upper portion of the device isolation film, thereby improving contact resistance properties and device operation properties, by reducing the contact junction leakage current.

Forming a contact hole using a self aligned contact process according to the present invention for fabricating a semiconductor device includes the steps of: forming an insulation film pattern exposing a device isolation region on a semiconductor substrate; forming a trench, by etching the semiconductor substrate using the insulation film pattern as an etching mask; forming an insulation film over the resultant structure; removing the insulation film according to a chemical mechanical polishing process for planarization, by employing the insulation film pattern as an etch barrier or end point; forming a device isolation film, by wet-etching the insulation film using an etching process having an etching selection ratio difference from the insulation film pattern, the device isolation film being formed lower than the semiconductor substrate; forming a protective film over the resultant structure, using a thin film that has an etching selection ratio difference from the device isolation film; removing the protective film on the insulation film pattern using a chemical mechanical polishing process; forming a protective film pattern on the surface of the device isolation film by removing the insulation film pattern; forming a stacked structure of a gate insulation film, a gate electrode and a mask insulation film pattern, and a word line having an insulation film spacer at its sidewalls in the active region of the semiconductor substrate; forming a planarization film over the resultant structure; forming a contact hole by etching the planarization film using a contact mask as an etching mask to expose the intended region for bit line contacts and storage electrode contacts on the active region of the semiconductor substrate; and forming a bit line contact plug and a storage electrode contact plug in the contact holes.

BRIEF DESCRIPTION OF THE DRAWINGS

The present invention will become better understood with reference to the accompanying figures which are given by way of illustration only. Thus the figures should not be understood to limit the present invention in a manner inconsistent with the claims provided below.

DETAILED DESCRIPTION OF THE PREFERRED EMBODIMENTS

A method for fabricating a semiconductor device in accordance with the present invention will now be described in detail with reference to the accompanying drawings.

Figure 1:
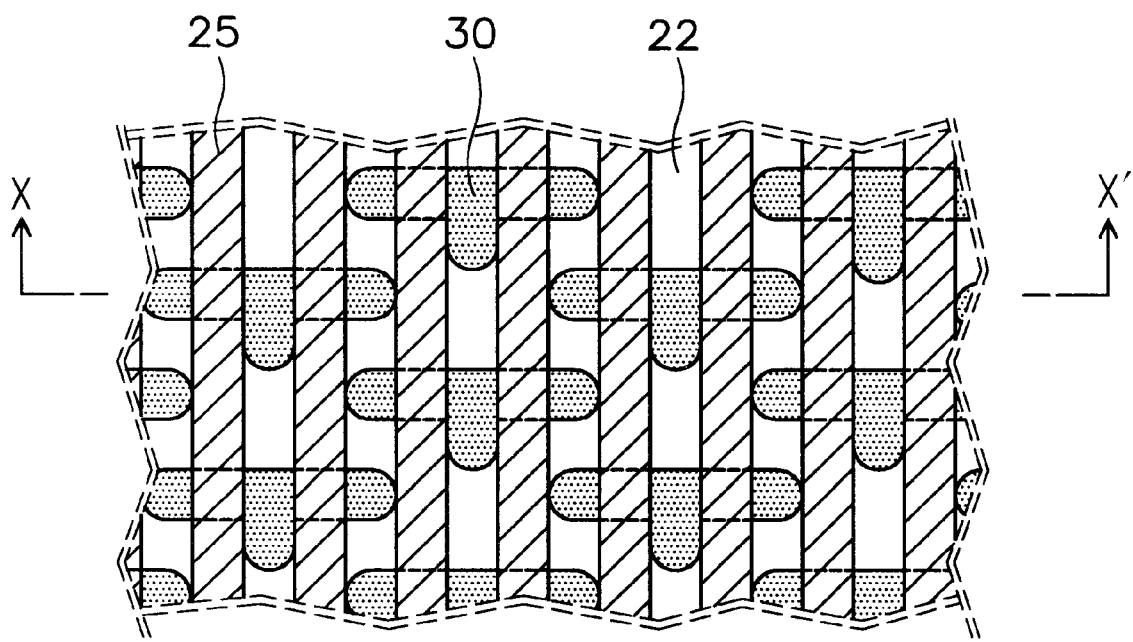
FIG. 1 is a layout diagram of a semiconductor device in accordance with the present invention.

FIG. 1 is a layout diagram of the semiconductor device in accordance with the present invention. A plurality of active regions 30 are defined by a device isolation film 22. A plurality of gate electrodes 25 are then formed thereon and overlapped with the active region 30.

FIGS. 2A through 2I are cross-sectional diagrams illustrating sequential steps of the method for fabricating the semiconductor device taken along line X-X' in FIG. 1.

Figure 2A:
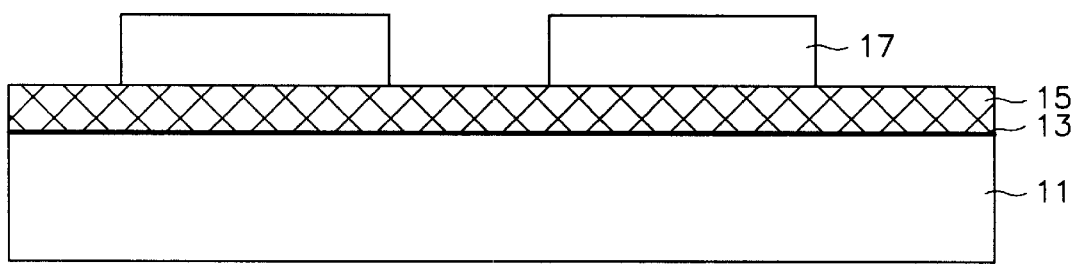
FIGS. 2A through 2I are cross-sectional diagrams illustrating sequential steps of a method for fabricating the semiconductor device taken along line X–X' in FIG. 1.

As illustrated in FIG. 2A, a pad oxide film 13 and a nitride film 15 are sequentially formed on a semiconductor substrate 11.

A first photoresist film pattern 17 exposing a presumed device isolation region is formed on the nitride film 15.

Figure 2B:
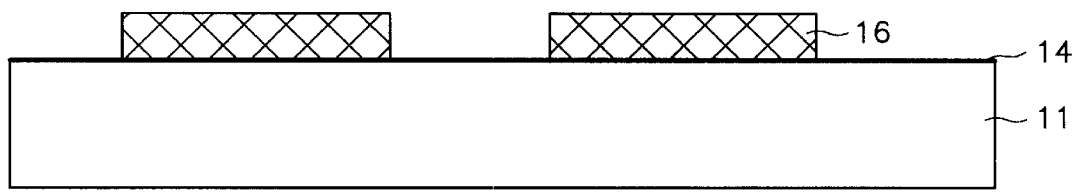

As depicted in FIG. 2B, the nitride film 15 is etched using the first photoresist film pattern 17 as an etching mask, thereby forming a nitride film pattern 16.

Thereafter, the first photoresist film pattern 17 is removed.

Figure 2C:
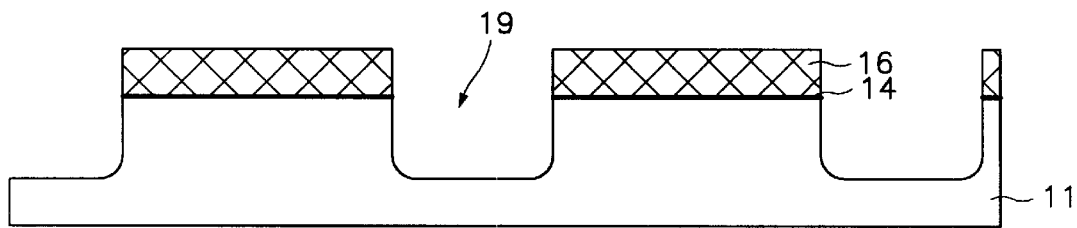

Referring to FIG. 2C, the pad oxide film 14 and the semiconductor substrate 11 are etched using the nitride film pattern 16 as an etching mask, thereby forming a pad oxide film pattern 14 and a trench 19.

Figure 2D:
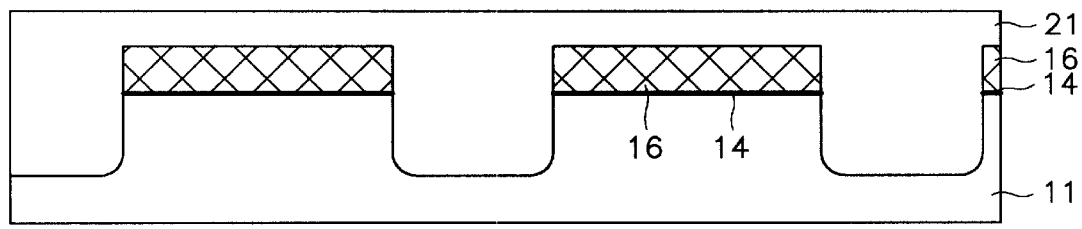

As shown in FIG. 2D, an oxide film 21 is formed over the resultant structure the oxide film having sufficient thickness to completely fill the trench 19.

Figure 2E:
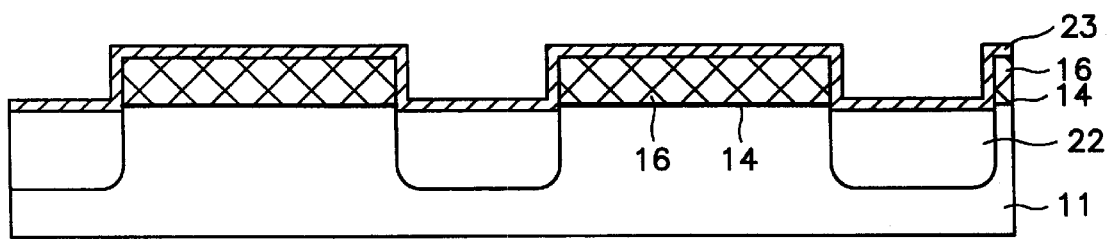

As illustrated in FIG. 2E, a portion of the oxide film 21 is removed using a chemical mechanical polishing (CMP) process, by utilizing the nitride film pattern 16 as an etch barrier or endpoint. A device isolation film 22 is formed to fill the trench 19 by removing a predetermined thickness of oxide film 21 using a wet etching process. The device isolation film 22 is formed to have a surface slightly lower than the active region of the semiconductor substrate 11. Here, the wet etching process is performed by using a mixed solution of $NH_4OH$, HF and deionized water or a mixed solution of HF and deionized water.

Thereafter, a protective film 23 for protecting the device isolation film 22 is formed over the resultant structure. The protective film 23 is selected from the group consisting of an SiN film, SiON film, $Al_2O_3$ film, $Ta_2O_5$ film, SiOCH film and SiCH film.

Figure 2F:
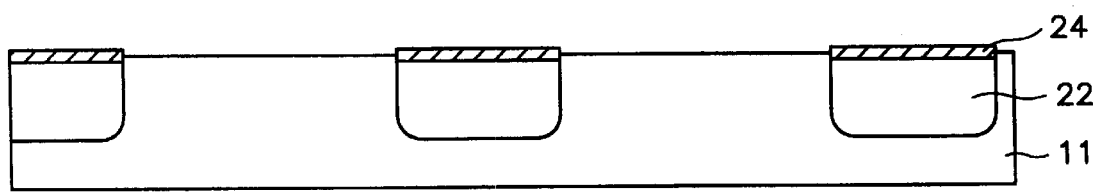

Referring to FIG. 2F, the protective film 23 and the nitride film pattern 16 are almost completely removed using a CMP process. Here, the CMP process is performed using the surface of the protective film 23 on the device isolation film 22 as the endpoint. Thereafter, a protective film pattern 24 is formed on the device isolation film 22 by removing the remainder of the nitride film pattern 16.

At this time, the nitride film pattern 16 may be removed using a wet etching process using a mixed solution of $H_3PO_4$ and deionized water. In addition, the nitride film pattern 16 may be removed using an isotropic dry etching process using a mixed gas of a fluorine-containing gas such as $CF_4$, $NF_3$, $SF_6$ or $C_2F_6$, an oxygen-containing gas such as $O_2$, $CO_2$, CO or $SO_2$, and an inert gas such as He, Ne, Ar or Xe.

Figure 2G:
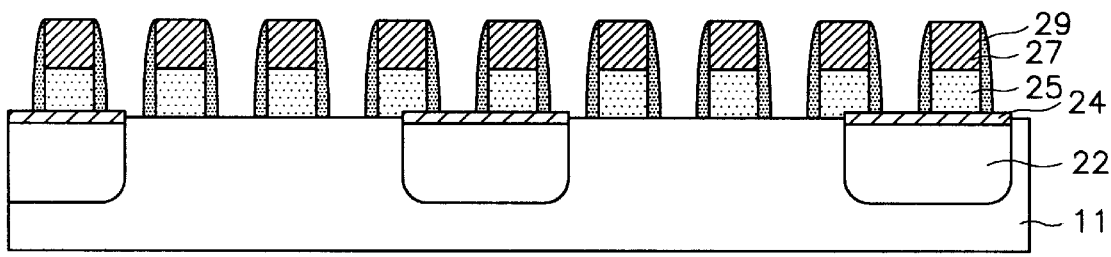

As depicted in FIG. 2G, a stacked structure of a gate insulation film (not shown), a conductive layer for a gate electrode and a mask insulation film are formed over the resultant structure.

A stacked structure pattern of a gate electrode 25 and a mask insulation film pattern 27 is formed, by etching the stacked structure using a gate electrode mask as an etching mask.

An insulation film spacer 29 is then formed at the sidewalls of the stacked structure pattern.

The mask insulation film pattern 27 consists of an SiN film, SiON film or Si-rich SiON (SRON) film. The mask insulation film pattern 27 is etched to have a vertical profile, by employing a mixed gas of $CF_4$, $O_2$ and Ar or a mixed gas of $CHF_3$, $O_2$ and Ar.

Figure 2H:
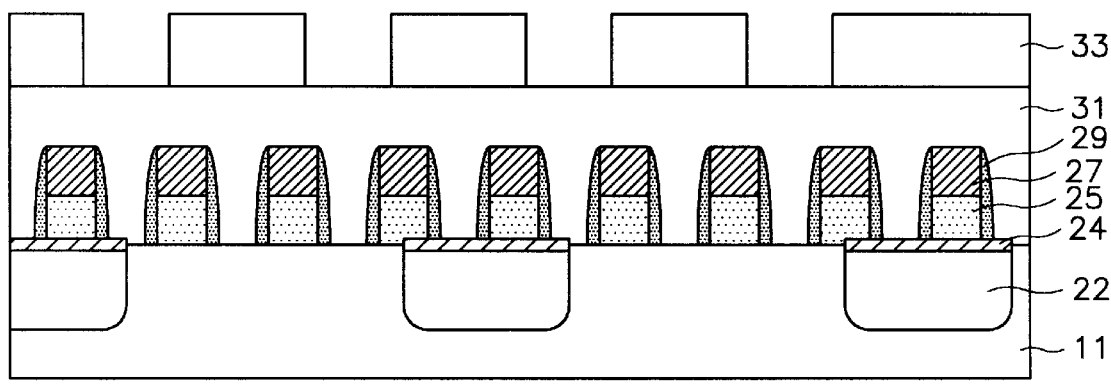

As shown in FIG. 2H, a planarization film 31 is formed over the resultant structure. A second photoresist film pattern 33 exposing the intended contact regions in the semiconductor substrate 11 is then formed on the planarization film 31. The planarization film 31 is formed using an oxide film having an etching selection ratio difference from the mask insulation film pattern 27, the insulation film spacer 29 and the device isolation film protective film pattern 24.

Figure 2I:
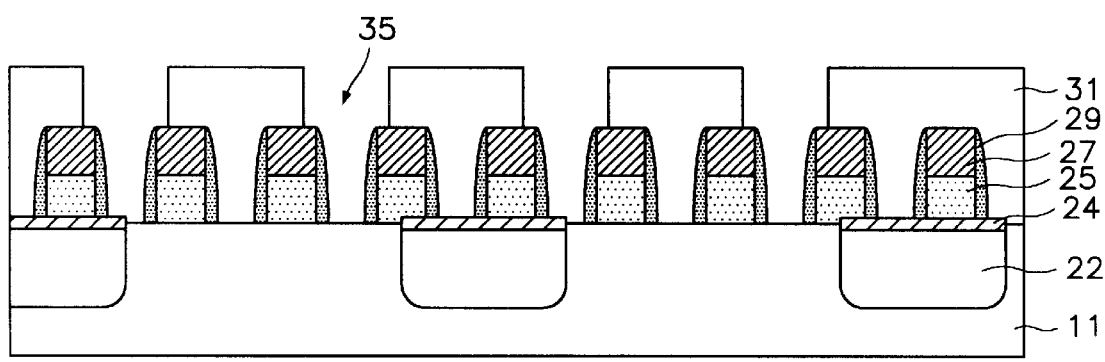

As illustrated in FIG. 2I, the planarization film 31 is etched by utilizing the second photoresist film pattern 33 as an etching mask, thereby forming a contact hole 35. The second photoresist film pattern 33 is then removed.

The planarization film 31 is etched using a perfluorocarbon-containing gas causing a large amount of polymers, such as $C_2F_6$, $C_2F_4$, $C_3F_6$, $C_3F_8$, $C_4F_6$, $C_4F_8$, $C_5F_8$, $C_5F_{10}$ or $C_2HF_5$ in order to increase the etching selection ratio difference from the mask insulation film pattern 27, the insulation film spacer 29 and the device isolation film protective film pattern 24.

In addition, a hydrogen-containing gas may be mixed with the perfluorocarbon-containing gas so as to increase the etching selection ratio, prevent an etch stop phenomenon and improve reproducibility in the etching process of the planarization film 31. Here, the hydrogen-containing gas is selected from the group consisting of $CHF_3$, $CH_3F$, $CH_2F_2$, $CH_2$, $CH_4$, $C_2H_4$ and $H_2$.

The planarization film 31 may be etched by using $C_xH_yF_z$ gas ($x \geq 2$, $y \geq 2$, $z \geq 2$) to obtain a further process margin.

An inert gas such as He, Ne, Ar or Xe is added to all the etching gases for the planarization film 31, thereby preventing the etch stop phenomenon.

Although not illustrated, a contact plug may be formed by forming a conductive layer and performing a CMP process thereon. Here, the conductive layer may be formed by using a tungsten layer, a polysilicon layer, a Ti/TiN layer, a selectively-formed tungsten layer or a silicon layer formed using a selective epitaxial growth method. Further the subsequent CMP process can be omitted when employing the selectively-formed tungsten layer or the silicon layer formed according to the selective epitaxial growth method to form the contact plugs.

As discussed earlier, in accordance with the present invention, the device isolation film protective film is formed on the device isolation film in the contact hole formation process, thereby preventing the device isolation film from being damaged due to misalignment in a lithography process. Accordingly, a gate induced drain leakage current is not generated, a contact junction leakage current is reduced, and the contact properties are improved. As a result, the electrical properties and yield of the semiconductor device are also improved.

As the present invention may be embodied in several forms without departing from the spirit or essential characteristics thereof, it should also be understood that the above-described embodiment is not necessarily limited to the specific details provided in the foregoing description, but rather should be construed broadly within the spirit and scope of the appended claims. All changes and modifications that fall within the metes and bounds of the claims, or equivalences of such metes and bounds are, therefore, intended to be embraced by the appended claims.

What is claimed is:

1. A method of forming a contact hole in a semiconductor device according to a self-aligned contact process comprising, in the following order, the steps of:

forming an insulation film pattern on a semiconductor substrate that exposes a device isolation region of the semiconductor substrate;

forming a trench by etching the device isolation region using the insulation film pattern as an etching mask;

forming an insulation film over the resulting structure;

performing a chemical mechanical polishing process to expose the insulation film pattern;

etching the insulation layer using a wet etch process to form a device isolation film in the trench, the surface of the device isolation film being lower then that of the semiconductor substrate;

forming a protective film over the resultant structure;

removing the protective film and the insulation film pattern by a chemical mechanical polishing process using the protective film over the device isolation film as a process endpoint to form a protective film pattern on the surface of the device isolation film;

removing the remaining portion of the insulation film pattern;

forming a stacked structure comprising a gate insulation film, a gate electrode pattern, and a mask insulation film pattern in the active region of the semiconductor substrate, the stacked structure having an insulation film spacer at its sidewalls;

forming a planarization film over the resulting structure; and etching the planarization film to expose the predetermined regions of the active region, thereby forming contact holes.

2. The method according to claim 1, wherein the insulation film pattern has a stacked structure comprising a pad oxide film pattern and a nitride film pattern.

3. The method according to claim 1, wherein the protective film formed from one or more materials selected from the group consisting of SiN, SiON, $Al_2O_3$, $Ta_2O_5$, SiOCH, and SiCH.

4. The method according to claim 1, wherein the wet etch process utilizes a mixed solution of HF and deionized water or a mixed solution of HF, deionized water and $NH_4OH$.

5. The method according to claim 2, wherein the nitride film pattern is removed using a wet etch process utilizing a mixed solution of $H_3PO_4$ and deionized water.

6. The method according to claim 2, wherein the nitride film pattern is removed using an isotropic dry etching process under a mixed gas, the mixed gas comprising a fluorine-containing gas, an oxygen-containing gas and an inert gas.

7. The method according to claim 1, wherein the mask insulation film pattern consists of a SiON film or a SRON film.

8. The method according to claim 1 or 7, wherein the mask insulation film pattern is etched with a mixed gas to form a vertical profile, the mixed gas comprising a mixture of $CF_4$, $O_2$ and Ar or a mixture of $CHF_3$, $O_2$ and Ar.

9. The method according to claim 1, wherein the planarization film is etched under an etch gas, the etch gas comprising a perfluorocarbon-containing gas, the perfluorocarbon-containing gas comprising at least one gas selected from the group consisting of $C_2F_6$, $C_2F_4$, $C_3F_6$, $C_3F_8$, $C_4F_6$, $C_4F_8$, $C_5F_8$, $C_5F_{10}$, and $C_2HF_5$.

10. The method according to claim 9, wherein the planarization film is etched using a mixed gas, the mixed gas comprising a perfluorocarbon-containing gas and a hydrogen-containing gas, in order to increase an etching selection ratio and prevent the occurrence of etch stop phenomenon.

11. The method according to claim 10, wherein the hydrogen-containing gas comprises one or more gases selected from the group consisting of $CHF_3$, $CH_3F$, $CH_2F_2$, $CH_2$, $CH_4$, $C_2H_4$, and $H_2$.

12. The method according to claim 1, wherein the planarization film is etched under an etch gas, the etch gas comprising a gas having the composition $C_xH_yF_z$ where x, y, and z are each at least 2.

13. The method according to claim 1, 9 or 12, wherein the etch gas further comprises an inert gas.

* * * * *